United States Patent
Goenka et al.

(10) Patent No.: US 11,211,940 B2
(45) Date of Patent: Dec. 28, 2021

(54) PINSTRAP DETECTION CIRCUIT

(71) Applicant: TEXAS INSTRUMENTS INCORPORATED, Dallas, TX (US)

(72) Inventors: Vibha Goenka, Bangalore (IN); Preetam Charan Anand Tadeparthy, Bangalore (IN); Vikram Gakhar, Bangalore (IN); Muthusubramanian Venkateswaran, Bengaluru (IN); Siddaram Mathapathi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/732,213

(22) Filed: Dec. 31, 2019

(65) Prior Publication Data

US 2021/0203346 A1    Jul. 1, 2021

(51) Int. Cl.
*H03M 1/36* (2006.01)
*H03M 1/46* (2006.01)
*H03M 1/76* (2006.01)

(52) U.S. Cl.
CPC .............. *H03M 1/362* (2013.01); *H03M 1/46* (2013.01); *H03M 1/76* (2013.01)

(58) Field of Classification Search
CPC .......... H03M 1/362; H03M 1/76; H03M 1/46; H03M 1/12; H03M 1/365
USPC .......................................... 341/139, 155, 159
See application file for complete search history.

(56) References Cited

U.S. PATENT DOCUMENTS

| | | | | |
|---|---|---|---|---|
| 5,014,055 | A * | 5/1991 | Dingwall | G11C 27/024 341/158 |
| 5,389,929 | A * | 2/1995 | Nayebi | H03M 1/162 341/122 |
| 5,894,241 | A | 4/1999 | Rees | |
| 6,384,621 | B1 | 5/2002 | Gibbs et al. | |
| 7,573,416 | B1 * | 8/2009 | Ren | H03M 1/002 341/155 |
| 7,642,943 | B1 * | 1/2010 | Cetin | H03M 1/007 341/156 |
| 7,888,923 | B2 * | 2/2011 | Sahu | H02M 3/1584 323/283 |
| 8,656,065 | B1 | 2/2014 | Gerhart et al. | |
| 8,698,471 | B2 * | 4/2014 | Gokingco | G01S 3/7803 323/285 |

(Continued)

OTHER PUBLICATIONS

Search Report for PCT Application No. PCT/US2020/067105, date of mailing of the international search report dated Apr. 8, 2021, 1 page.

*Primary Examiner* — Jean B Jeanglaude
(74) *Attorney, Agent, or Firm* — Michael A. Davis, Jr.; Charles A. Brill; Frank D. Cimino

(57) ABSTRACT

In at least some examples, an integrated circuit includes an input pin and an analog-to-digital converter (ADC) comprising an input terminal coupled to the input pin and an output terminal. The integrated circuit further includes a logic circuit comprising an input terminal coupled to the output terminal of the ADC, a first output terminal, and a second output terminal. The integrated circuit further includes a resistance circuit. In an example, the resistance circuit includes a resistor coupled between the input pin and a first node, a first switch coupled between the first node and a reference voltage pin, and a second switch coupled between the first node and a ground pin.

20 Claims, 3 Drawing Sheets

(56) References Cited

U.S. PATENT DOCUMENTS

| | | | | |
|---|---|---|---|---|
| 8,952,839 | B2* | 2/2015 | Wang | H03K 5/24 |
| | | | | 341/161 |
| 9,350,380 | B2* | 5/2016 | Chen | H03M 1/002 |
| 9,491,394 | B2* | 11/2016 | Horvath | H03J 5/24 |
| 9,934,923 | B2* | 4/2018 | Ahmed | H01H 9/54 |
| 10,033,285 | B1* | 7/2018 | Zhang | H02M 3/33523 |
| 10,289,579 | B2* | 5/2019 | Mishra | G06F 13/24 |
| 10,295,572 | B1* | 5/2019 | Mai | H03K 17/08 |
| 2015/0236648 | A1* | 8/2015 | Ahmad | H03F 3/45977 |
| | | | | 330/84 |
| 2018/0158814 | A1 | 6/2018 | Salcedo et al. | |
| 2018/0284178 | A1* | 10/2018 | Brychta | G01R 31/088 |

* cited by examiner

PINSTRAP DETECTION CIRCUIT

BACKGROUND

Some electrical components include a plurality of mode of operation, operational settings, or other characteristics that are programmable after the electrical component has been manufactured. These settings can sometimes be set by a consumer of the electrical components who implements the electrical components in a larger circuit, device, or system. As a number of available settings for electrical components grows, so too may a consumer desire for the electrical components to be simply and precisely programmed.

SUMMARY

Aspects of the present disclosure provide for an integrated circuit. In at least some examples, the circuit include an input pin and an analog-to-digital converter (ADC) comprising an input terminal coupled to the input pin and an output terminal. The circuit further includes a logic circuit comprising an input terminal coupled to the output terminal of the ADC, a first output terminal, and a second output terminal. The circuit further includes a resistance circuit. In an example, the resistance circuit includes a resistor coupled between the input pin and a first node, a first switch coupled between the first node and a reference voltage pin, and a second switch coupled between the first node and a ground pin.

Other aspects of the present disclosure provide for an integrated circuit. In at least some examples, the circuit includes an input pin and an ADC comprising an input terminal coupled to the input pin and an output terminal. The circuit also includes a resistance circuit comprising an output terminal coupled to the input pin, a first input terminal. The circuit also includes a logic circuit comprising an input terminal coupled to the output terminal of the ADC and a first output terminal coupled to the first input terminal of the resistance circuit. The logic circuit is configured to generate a first ADC control signal to control the ADC to determine a voltage present at the input pin with a first value of resistance present at the input pin. The logic circuit is further configured to generate a control signal to control the resistance circuit to modify the first value of resistance to a second value of resistance. The circuit is further configured to generate a second ADC control signal to control the ADC to determine a second voltage present at the input pin as changed according to the second value of resistance and determine the first value of resistance based at least partially on the voltage present at the input pin, the second voltage present at the input pin, a resistance of the resistance circuit, and a reference voltage.

Other aspects of the present disclosure provide for a system. In at least some examples, the system includes a programmable electrical component and a voltage divider. The programmable electrical component includes an input pin, a reference voltage pin, a ground pin, an ADC comprising an input terminal coupled to the input pin and an output terminal, a resistance circuit comprising an output terminal coupled to the input pin, a first input terminal, and a logic circuit. The logic circuit includes an input terminal coupled to the output terminal of the ADC and a first output terminal coupled to the first input terminal of the resistance circuit. The logic circuit is configured to generate a first ADC control signal to control the ADC to determine a voltage present at the input pin with a first value of resistance present at the input pin. The logic circuit is further configured to generate a control signal to control the resistance circuit to modify the first value of resistance to a second value of resistance. The logic circuit is further configured to generate a second ADC control signal to control the ADC to determine a second voltage present at the input pin as changed according to the second value of resistance and determine the first value of resistance based at least partially on the voltage present at the input pin, the second voltage present at the input pin, a resistance of the resistance circuit, and a reference voltage present at the reference voltage pin. The voltage divider is coupled between the reference voltage pin and the ground pin and has an output coupled to the input pin.

BRIEF DESCRIPTION OF THE DRAWINGS

For a detailed description of various examples, reference will now be made to the accompanying drawings in which.

DETAILED DESCRIPTION

Figure 1:
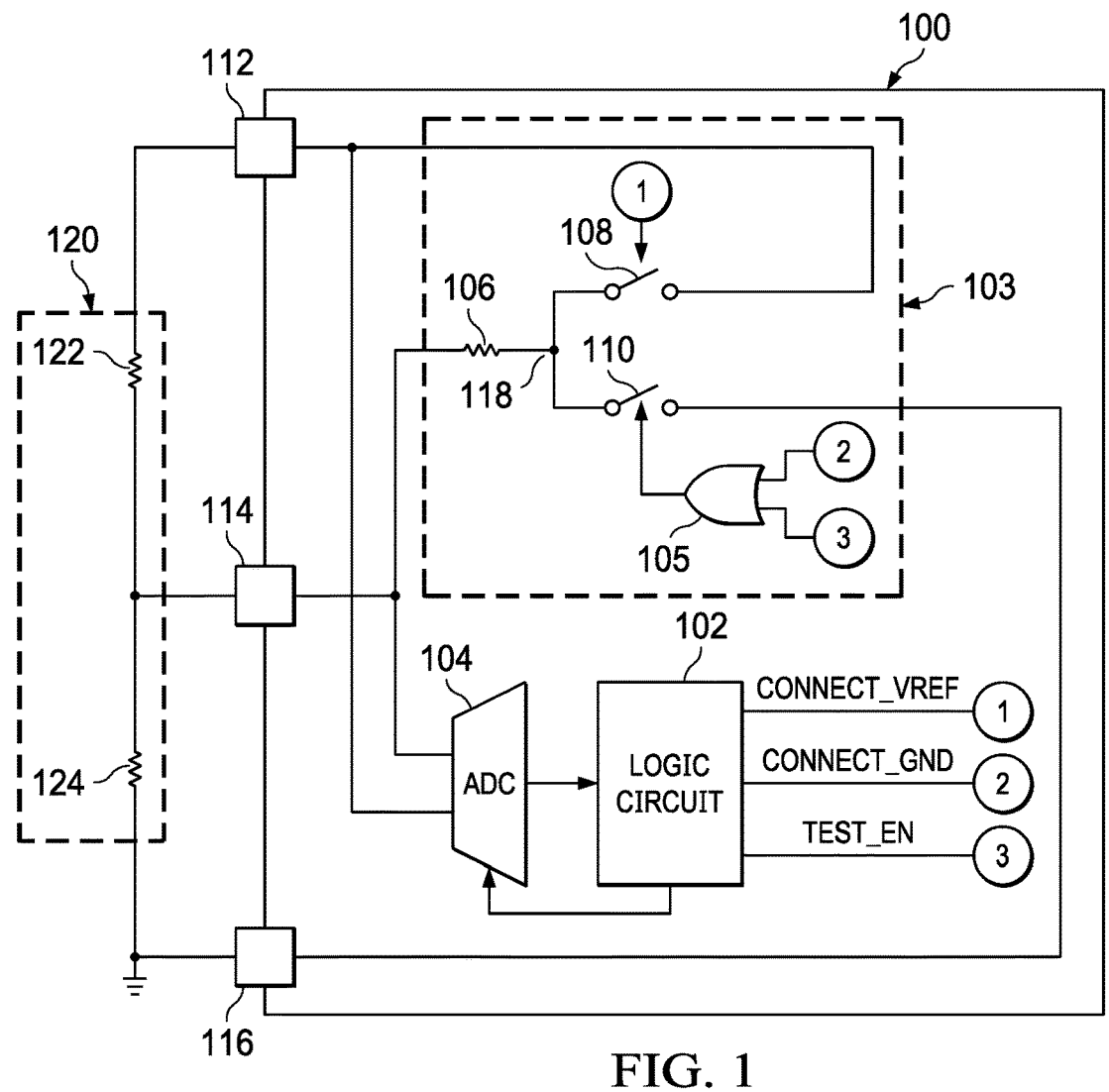
FIG. 1 shows a schematic diagram of an illustrative electrical component in accordance with various examples.

For electrical components that are intended to be programmable after manufacturing, one such approach to programming the components is pinstrap detection. Pinstrap detection is a process by which a known reference voltage (VREF), in some examples output by the electrical component performing the pinstrap detection, is monitored at an input terminal of the electrical component to determine a voltage present at that input terminal. In some examples, an output terminal of the electrical component at which VREF is provided is a VREF pin of the electrical component. In other examples, VREF is provided by any suitable source and its value is known to the electrical component either through reporting to the electrical component, control exerted by the electrical component, or measurement by the electrical component. Various voltages present at the input terminal correspond or map to particular settings of the electrical component, as communicated to a user of the electrical component through a datasheet or other instructions for implementing the electrical component in a circuit. To program the electrical component, a user may couple a voltage divider between the VREF pin and a ground (GND) pin or node. An output of the voltage divider is then coupled to the input terminal of the electrical component such that a ratio of resistances in the voltage divider controls a voltage present at the input terminal. Generally, an amount of resistance of the voltage divider present between the VREF pin and the input terminal is referred to as a top resistance (RTOP) and an amount of resistance of the voltage divider present between the input terminal and the GND pin is referred to as a bottom resistance (RBOT). RTOP and RBOT may each be provided by one or more elements having a measurable impedance. For example, RTOP and/or RBOT may each be implemented by a single resistor, a potentiometer, a plurality of coupled resistors, or any other suitable elements capable of providing a measurable amount of impedance or resistance. By altering a value of RTOP and/or RBOT, the user may control the voltage present at the input terminal and thereby program the electrical component.

The above pinstrap detection process provides two degrees of flexibility in making measurements. For example, in addition to the above voltage measurement, a value of RTOP or RBOT may also be determined. Some approaches exist for pinstrap detection of a resistance of a resistor of the voltage divider, but these approaches suffer from limited accuracy and/or comparatively high cost (e.g., such as through die surface area consumed to implement the approach). One such approach involves forcing VREF through a buffer, where a current mirror mirrors an output current of the buffer to an internal resistor (RINT) contained in the electrical component. A voltage across RINT is measured to determine RBOT. However, this approach may be highly inaccurate. For example, percentage error in RBOT determination increases due to buffer offset that increases as the voltage present at the input terminal increases. Thus, the buffer is often implemented as a low-offset amplifier, which when combined with the current mirror, is large in die surface area when compared to other components such as resistors and/or transistors. The increase in size increases cost of manufacturing the electrical component and, in some circumstances, runs counter to customer requests for a minimal size of the electrical component.

At least some aspects of the present disclosure provide for a pinstrap detection circuit. The pinstrap detection circuit of the present disclosure, in at least some examples, is suitable for detecting a voltage present at the input terminal to 5 bits of accuracy and detecting RBOT to 4 bits of accuracy. In other examples, the pinstrap detection circuit of the present disclosure is suitable for detecting a voltage present at the input terminal to greater than 5 bits of accuracy and detecting RBOT to greater than 4 bits of accuracy based on minimized component process and temperature variation of the pinstrap detection circuit and/or resistors providing RTOP and RBOT. For example, an input terminal of an analog-to-digital converter (ADC) is coupled to the input terminal and generates a digital signal representative of the voltage present at the input terminal. In at least some examples, this digital signal representative of the voltage present at the input terminal is referred to as a pin voltage (VP), such as when RINT is not coupled in parallel with RBOT or RTOP. In other examples, the digital signal representative of the voltage present at the input terminal is referred to as a sensed voltage (VS), such as when RINT is coupled in parallel with RBOT or RTOP. In at least some examples, the digital signal is provided to a digital core or other processing element. The digital core or processing element processes the digital code to generate one or more additional values. For example, the digital core processes VP to generate VCODE and for use in determining VS. The digital code processes VS for use in determining RBOT, and correspondingly RCODE. In at least some examples the voltage present at the input terminal may vary due to resistor tolerance errors or other factors. Accordingly, in at least some examples the digital core utilizes fewer than all 11 bits (e.g., such as only a least significant 5 bits) of VP when generating VCODE for use in programming a setting of the digital core or another component or device. In some examples, precision of the bits of VCODE with respect to VP is increased when using fewer than all bits of VP to generate VCODE for use in programming settings.

In some examples, VS is measured after VP such that the ADC generates two separate digital codes. In other examples, VP is measured after VS. In at least one example, the ADC measures the voltage present at the input pin to generate VP. In at least some examples, after the ADC generates VP, the digital core generates VCODE based on VP. The digital core further determines a value of VCODE with respect to one or more threshold values. Based on that determination, the digital core generates and outputs a control signal (e.g., a switch control signal). The control signal controls a switch of the pinstrap detection circuit to couple RINT in parallel with RTOP or RBOT to enable the measuring of VS. The ADC then measures the voltage present at the input node to generate VS. After the ADC generates VS, the digital core processes VS, VP, VREF, and/or RINT to generate a digital code (RCODE) that represents RBOT. In at least some examples, RINT has a value configured to cause VS to have a value nearer than VP to a value of VREF/2. Causing VS to have a value nearer than VP to a value of VREF/2 maximizes a resolution of detectable RBOT values. Based on values of VCODE and RCODE, the digital core is programmed with particular settings that correspond to values of VCODE and RCODE. As discussed above, in at least some examples fewer than all bits of VCODE are utilized in programming the digital core. For example, about 5 or more bits of VCODE (e.g., a least significant 5 bits of VCODE) and about 4 bits of RCODE (e.g., a least significant 4 bits of RCODE) are used in programming the digital core. This provides an improvement in a number of settings for the electrical component that can be accurately set using input provided at one pin of the electrical component. The improvement in the number of settings programmable using one pin at least partially results from the increased precision of RBOT and RCODE determination according to the pinstrap detection of the present disclosure.

Turning now to FIG. 1, a schematic diagram of an illustrative electrical component 100 is shown. In at least some examples, the electrical component 100 is representative of any electrical component that includes one or more elements disposed on a semiconductor die and/or enclosed in a component package with a specified number of pins exposed outside of the component package for coupling to the elements disposed on the semiconductor die. The electrical component 100 may have any suitable principal functionality, the scope of which is not limited herein. For example, the electrical component 100 may be an analog component, a digital component, or a combination of the two, that is configured to provide certain processing and/or control functionality. In at least one examples, the electrical component is, or is a component of, a power controller such as a direct-current to direct-current power controller. To implement its principal functionality, the electrical component 100 may further include various supporting functionality. For example, the electrical component 100 may include functionality for a user to specify one or more desired settings for operation of the electrical component 100. This selection may be performed according to a pinstrap methodology in which a voltage and/or resistance is detected at the pin and mapped to a certain predefined setting or function of the electrical component 100 that corresponds to the voltage and/or resistance.

In at least one example architecture, the electrical component 100 includes a logic circuit 102, an resistance circuit 103, and an ADC 104. The resistance circuit 103 includes a resistor 106, a switch 108, and a switch 110. In at least some examples, the resistance circuit 103 further includes a logic circuit 105. In some examples, the logic circuit 102 is a circuit capable of performing processing and/or decision making, such as a digital core. The logic circuit 105 is, in some examples, a circuit capable of, or suitable for, performing a logical OR operation according to a plurality of input signals to generate an output signal that is asserted when any of the plurality of input signals is asserted. In at least some examples, the resistor 106 has a resistance of a RINT. The resistor 106, while illustrated as a single resistor having a defined value, may instead be a programmable resistor (e.g., a potentiometer) having a resistance value controlled by the logic circuit 102 or any other suitable control device. Alternatively, or additionally, the resistor 106 may be representative of any combination of parallel and/or series coupled components that have a measurable and/or definable amount of resistance. Further, in at least some examples the electrical component 100 includes a VREF pin 112, an input pin 114, and a GND pin 116. The VREF pin 112, the input pin 114, and the GND pin 116, in some examples, provide an interface to the electrical component 100 for a user, via one or more components external to the electrical component 100, to interact with components of, or within, the electrical component 100. In at least some examples, the input pin 114 is multi-use such that after performing pinstrap detection according to the present disclosure, the input pin 114 is used in the electrical component 100 for another purpose, the scope of which is not limited herein.

In some examples, the ADC 104 has an input terminal coupled to the input pin 114 and an output terminal coupled to an input terminal of the logic circuit 102. In at least some examples, the ADC 104 has one or more additional input terminals, such as when the ADC 104 is a multi-channel ADC. For example, the ADC 104 may include another input terminal coupled to the VREF pin 112. When the ADC 104 is a multi-channel ADC, the ADC 104 includes, or is configured to couple to, a multiplexor (not shown) at its input terminal such that the ADC 104 receives an output of the multiplexor as its input signal. The multiplexor, in turn, couples to the nodes previously ascribed herein to the input terminals of the ADC 104. For example, the multiplexor includes respective input terminals that coupled to the input pin 114 and the VREF pin 112. The ADC 104 (or the multiplexor) further includes a control input that receives control signals (e.g., one or more ADC control signals) from the logic circuit 102 to control which analog input signal is converted to a digital signal by the ADC 104. While illustrated in FIG. 1 as a single coupling for control signals between the logic circuit 102 and the ADC 104, in various examples any number of couplings may exist based on a number of channels of the ADC 104 (e.g., a number of unique input terminals of the multiplexor) or any other suitable criteria. The resistor 106 has a first terminal coupled to the input pin 114 and a second terminal coupled to a node 118. The switch 108 is coupled between the node 118 and the VREF pin 112 and is configured to receive and be controlled by a first control signal (e.g., switch control signal) received from the logic circuit 102. The switch 110 is coupled between the node 118 and the GND pin 116 and is configured to receive and be controlled by a second control signal (e.g., switch control signal) received from the logic circuit 102. The switch 108 and the switch 110 may each be implemented according to any suitable technology, the scope of which is not limited herein. In at least one example, the switch 108 and the switch 110 are each implemented as solid-state devices, such as transistors of any suitable process technology.

Although not shown in the electrical component 100, in at least some examples the electrical component 100 includes circuitry for providing VREF having a known value to the VREF pin 112. The circuitry for the electrical component 100 to generate and/or provide VREF at the VREF pin 112 may be implemented in multiple suitable architectures, the scope of which is not limited herein. The electrical component 100 does not include, but is configured to couple to, a voltage divider 120. The voltage divider 120 includes a resistor 122 and a resistor 124. As discussed above with respect to the resistor 106, the resistor 122 and the resistor 124 each are representative of any one or more coupled components that provide a measurable and/or defined amount of resistance. As further suggested above, a resistance of the resistor 122 is referred to as RTOP and a resistance of the resistor 124 is referred to as RBOT.

In an example of operation of the electrical component 100, the electrical component 100 is programmable according to a plurality of settings to provide various functionality. In some examples, the electrical component 100 may be programmable according to tens, hundreds, or thousands of settings. The settings are programmed to the electrical component 100, in some examples, based at least partially on a mapping between a particular setting and a voltage and/or resistance present at the input pin 114. For example, based on a voltage measured at the input pin 114 and a determination of RBOT, the electrical component 100 is programmed by the logic circuit 102 with the particular setting that maps to the measured voltage and determined RBOT.

To program the electrical component, in at least some examples a user couples the resistor 122 between the VREF pin 112 and the input pin 114 and couples the resistor 124 between the input pin 114 and the GND pin 116. The electrical component 100 sources VREF to the VREF pin 112 to cause a voltage modified by the voltage divider 120 to be present at the input pin 114. The voltage present at the input pin 114 is referred to as VP, as discussed above, and is determined based on a value of VREF and values of RBOT and RTOP. In at least some examples, the ADC 104 detects a voltage present at the VREF pin 112 and generates a digital signal representation of VREF. The ADC 104 provides that digital signal representation of VREF to the logic circuit 102 for subsequent use by the logic circuit 102, for example, as a variable in an equation to generate RCODE, as discussed in greater detail elsewhere herein. The ADC 104 detects a voltage present at the input pin 114 in an analog format and generates VP in a digital format based on the detected voltage. The ADC 104 subsequently provides VP to the logic circuit 102 which, in some examples, generates and stores VCODE for subsequent use in programming the electrical component 100. In at least some examples, the logic circuit 102 further stores VP for subsequent use, such as in determining RCODE.

After determining VCODE, in at least some examples the electrical component 100 determines RCODE. In at least some implementations, RCODE is a digital value representation of RBOT. In other implementations, RCODE is a digital value representation of RTOP. To generate RCODE, the logic circuit 102, or another suitable control device, controls one of the switch 108 or the switch 110 to close and form an electrically conductive path across the respective switch 108 or the switch 110. When the switch 108 and the switch 110 are normally-open devices, they are controlled to close when a signal received from the logic circuit 102 is asserted. Alternatively, in other examples, the switch 108 or the switch 110 is configured to be closed when a signal received from the logic circuit 102 is de-asserted. When one of the switch 108 or the switch 110 is closed, the other of the switch 108 or the switch 110 is open such that at any given time, in some examples, neither, or only one, of the switch 108 or the switch 110 is closed. Thus, by closing the switch 108 or the switch 110, the resistor 106 is coupled in parallel with the resistor 122 or the resistor 124, respectively. When VP is known based on the previously performed measurements, such as for determination of VCODE, and a value of the resistor 106 is known based on it being an included component within the electrical component 100, a value of RTOP or RBOT may be determined.

For example, after closing one of the switch 108 or the switch 110, a new voltage becomes present at the input pin 114 and is modified from the value (e.g., represented in the digital domain as VP) that it was prior to the closing of the switch 108 or the switch 110. The ADC 104 detects the new voltage at the input pin 114 in an analog format and generates VS based on the detected new voltage. The ADC 104 subsequently provides VS to the logic circuit 102 which, in some examples, determines RCODE based at least partially on VS. For example, in some implementations the logic circuit 102 implements an equation that determines RCODE based on the received digital code, the previously determined and/or stored VP, VREF, and the known RINT. In examples in which the switch 108 couples the resistor 106 in parallel with the resistor 122, the logic circuit 102 determines RCODE based on the following equation 1.

$$RCODE = RBOT = \frac{(VREF) * \left(\frac{VS}{VP} - 1\right) * RINT}{\left(\frac{VREF}{VP} - 1\right) * (VREF - VS)} \quad (1)$$

In examples in which the switch 110 couples the resistor 106 in parallel with the resistor 124, the logic circuit 102 determines RCODE based on the following equation 2.

$$RCODE = RBOT = \frac{(VREF) * \left(\frac{1}{VS} - \frac{1}{VP}\right) * RINT}{\left(\frac{VREF}{VP} - 1\right)} \quad (2)$$

In other examples, the logic circuit 102 access a look-up table stored in a memory (not shown) to determine a value of RCODE based on VS and VP. For example, the look-up table includes one of VS or VP on a horizontal axis of the look-up table and the other of VS or VP on a vertical axis of the look-up table. Intersections in the look-up table for a specific VS and VP indicate a value of RCODE for that specific VS and VP combination. In implementations in which the logic circuit 102 utilizes a look-up table in place of implementing the equation 1 and/or the equation 2, the logic circuit 102 may not include mathematical engine capabilities (e.g., the ability to perform mathematical calculations). Not including the mathematical engine capabilities, in at least some examples, results in a smaller physical size (and therefore reduced cost) of the logic circuit 102, reduced power consumption by the logic circuit 102, and/or a faster time to determination of RCODE.

The logic circuit 102 determines which of the switch 108 or the switch 110 to close, in some examples, based on a value of VCODE. For example, when VCODE has a value greater than a threshold, the logic circuit 102 controls one of the switch 108 or the switch 110 to close. When VCODE has a value less than the threshold, the logic circuit 102 controls the other of the switch 108 or the switch 110 to close. In some implementations, the logic circuit 102 generates and outputs a control signal CONNECT_VREF to control the switch 108 to close when a decimal value of VCODE is less than about sixteen. The logic circuit 102 further generates and outputs a control signal CONNECT_GND to control the switch 110 to close when a decimal value of VCODE is greater than about fifteen. More generally, in at least some implementations the logic circuit 102 generates and outputs the control signal CONNECT_VREF to control the switch 108 to close when a decimal value of VCODE is less than about VREF/2. The logic circuit 102 further generates and outputs the control signal CONNECT_GND to control the switch 110 to close when a decimal value of VCODE is greater than about VREF/2. Alternatively, in other examples, the logic circuit 102 determines which of the switch 108 or the switch 110 to close based on a value of VP. In such examples, VP replaces VCODE in descriptions herein regarding generation of CONNECT_VREF or CONNECT_GND.

By coupling the resistor 106 in parallel with the resistor 122 or the resistor 124 based on the above scheme, in at least some examples the logic circuit 102 causes VS to have a value closer to VREF/2 than VP does. In at least some examples, causing VS to have a value closer to VREF/2 than VP does increases a resolution of detectable changes in RBOT. For example, when VP is very close in value to VREF, then RBOT is significantly larger than RTOP (e.g., RBOT>>RTOP). In this circumstance, for a small change in value of the voltage present at the input pin 114, a large change in RBOT will occur. Thus, potential error made by the ADC 104 in generation of VS will lead to a large error in RBOT detection. However, coupling the resistor 106 in parallel with the resistor 124 limits RBOT to a lower value, thus bringing a voltage present at the input pin closer in value to VREF/2. In such an example, an error made by the ADC 104 in generating VS will lead to a lower error in RBOT detection, thereby improving the RBOT detection resolution.

Similarly, when VP is close in value to a value present at the GND pin 116, RTOP>>RBOT. In this circumstance, a small change in RBOT will cause a large change in VS. By coupling the resistor 106 in parallel with the resistor 122, RTOP is limited to a lower value, thus bringing VS closer in value to VREF/2. In such an example, an error made by the ADC 104 in generating VS will lead to a lower error in RBOT detection, thereby improving the RBOT detection resolution. For example, if the ADC 104 introduces error into a value of VS, an impact of the error is increased because of the large change of the VS being measured by the ADC 104. However, because only a small change in RBOT occurs for a large change in VS as a result of VP being close in value to a value present at the GND pin 116, and therefore VS being close in value to VREF/2, a corresponding error in RBOT will be minimal.

In some examples, variation exists in RINT from an expected or ideal value of resistance. In at least some examples, left uncompensated for, a percentage error in RINT from the expected or ideal value is directly translated to a same percentage error in a detected or calculated RBOT, and therefore an error in RCODE. Accordingly, in at least some examples it is advantageous to determine and/or compensate for this variation. To determine the variation, in at least some examples the electrical component 100 includes a calibration or test mode of operation. To enter the calibration mode of operation, the logic circuit 102 generates and outputs a control signal TEST_EN having an asserted value. The control signal is received by the logic circuit 105 and, when asserted, causes the switch 110 to close to couple the resistor 106 in parallel with the resistor 124. While operating in the test mode, resistors having known values are utilized as the resistor 122 and the resistor 124. Subsequently, the logic circuit 102 determines RINT. Because values of the resistor 122 and the resistor 124 are known, and an expected RINT is known, the logic circuit 102 can then determine a variation of an actual value of RINT from the expected value of RINT. In at least some examples, the logic circuit 102 stores a value indicating the variation as an RINT offset in a storage element (not shown) such as a register, a one-time-programmable (OTP) memory, or other suitable memory or data storage structure. In subsequent normal operation (e.g., when not operating in the test mode), the logic circuit 102 modifies RINT in calculating equation 1 and equation 2 according to the RINT offset. In at least some examples, determination of the RINT offset compensates for variation in the actual value of RINT from an expected value of RINT to within about 0.2% accuracy.

Figure 2:
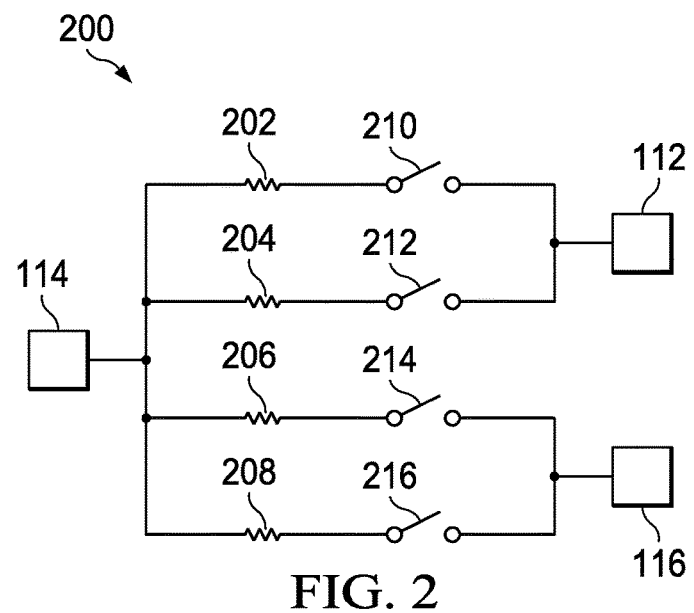
FIG. 2 shows a schematic diagram of an illustrative resistance circuit in accordance with various examples.

Turning now to FIG. 2, a schematic diagram of an illustrative resistance circuit 200 is shown. In at least some examples, the resistance circuit 200 replaces the resistor 106, the switch 108, and the switch 110 of the electrical component 100 of FIG. 1. For example, in at least some implementations the resistance circuit 200 is suitable for implementation as (e.g., in place of) the resistance circuit 103. Accordingly, reference may be made to at least some components and/or signals of the electrical component 100 in describing the resistance circuit 200.

The resistance circuit 200 includes, in some examples, a resistor 202, a resistor 204, a resistor 206, a resistor 208, a switch 210, a switch 212, a switch 214, and a switch 216. In at least one example architecture, the resistor 202 and the switch 210 are coupled in series between the input pin 114 and the VREF pin 112. The resistor 204 and the switch 212 are also coupled in series between the input pin 114 and the VREF pin 112. The resistor 206 and the switch 214 are coupled in series between the input pin 114 and the GND pin 116. The resistor 208 and the switch 216 are also coupled in series between the input pin 114 and the GND pin 116. Although not shown, each of the switch 210, the switch 212, the switch 214, and the switch 216 are, in some examples, configured to receive respective control signals from the logic circuit 102 to control a state (e.g., open or closed) of the switch 210, the switch 212, the switch 214, and the switch 216. While two resistor and switch pairs are illustrated and described as being coupled between the input pin 114 and each of the VREF pin 112 and the GND pin 116, in various other examples any number of resistor and switch pairs are coupled between the input pin 114 and each of the VREF pin 112 and the GND pin 116. In some examples, a same number of resistor and switch pairs are coupled between the input pin 114 and each of the VREF pin 112 and the GND pin 116. In other examples, a different number of resistor and switch pairs are coupled between the input pin 114 and one of the VREF pin 112 or the GND pin 116 than the other of the VREF pin 112 or the GND pin 116.

In at least some examples of operation of the resistance circuit 200, such as when the ADC 104 is an 11-bit ADC, a maximum decimal value of VCODE is 31. Based on the decimal value of VCODE, the logic circuit 102 controls one of the switch 210, the switch 212, the switch 214, or the switch 216 to close and a remainder of the switch 210, the switch 212, the switch 214, or the switch 216 to remain, or become, open. For example, when the maximum value of VCODE is 31, the logic circuit 102 controls the switch 210 to close (and the switches 212, 214, and 216 to be open), when the decimal value of VCODE is between 0 and 7, inclusive. The logic circuit 102 further controls the switch 212 to close (and the switches 210, 214, and 216 to be open), when the decimal value of VCODE is between 8 and 15, inclusive. The logic circuit 102 further controls the switch 214 to close (and the switches 210, 212, and 216 to be open), when the decimal value of VCODE is between 16 and 23, inclusive. The logic circuit 102 further controls the switch 216 to close (and the switches 210, 212, and 214 to be open), when the decimal value of VCODE is between 24 and 31, inclusive.

Generally, the logic circuit 102 generates one or more control signals to control one or more switches of the resistance circuit 200 to have states causing VS to approach VREF/2 in value. For example, in at least some implementations the resistor 202, the resistor 204, the resistor 206, and the resistor 208 have varied values of resistance optimized for certain values, or value ranges, of VCODE. By determining the value of VCODE, the logic circuit 102 then controls the switch 210, the switch 212, the switch 214, and/or the switch 216 to have states configured to cause VS to approach VREF/2. For example, based on the states of the switch 210, the switch 212, the switch 214, and the switch 216, an amount of resistance coupled in parallel with the resistor 222 or the resistor 224 changes. Changing the amount of resistance coupled in parallel with the resistor 222 or the resistor 224 brings VS closer in value to VREF/2 than the previously measured VP, the least significant 5 bits of which were stored by the logic circuit 102 as VCODE when the switch 210, the switch 212, the switch 214, and the switch 216 were each open.

Figure 3:
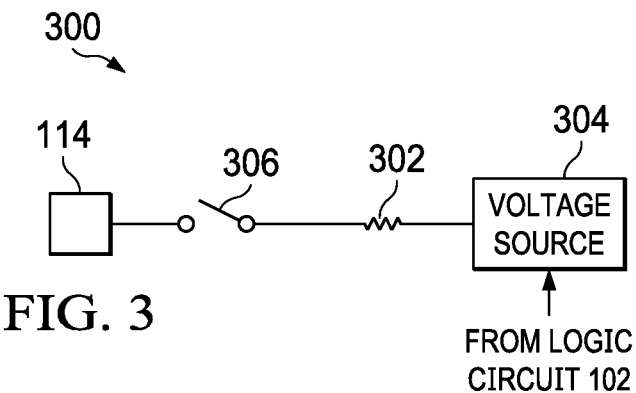
FIG. 3 shows a schematic diagram of an illustrative resistance circuit in accordance with various examples.

Turning now to FIG. 3, a schematic diagram of an illustrative resistance circuit 300 is shown. In at least some examples, the resistance circuit 300 replaces the resistor 106, the switch 108, and the switch 110 of the electrical component 100 of FIG. 1. For example, in at least some implementations the resistance circuit 300 is suitable for implementation as (e.g., in place of) the resistance circuit 103. Accordingly, reference may be made to at least some components and/or signals of the electrical component 100 in describing the resistance circuit 300.

In at least one example, the resistance circuit 300 includes a resistor 302 and a voltage source 304. The resistor 302 is coupled between an output terminal of the voltage source 304 and the input pin 114. In some examples, the resistance circuit 300 further includes a switch coupled between the resistor 302 and the input pin 114. The voltage source 304 is, in some examples, a digital-to-analog converter (DAC). In other examples, the voltage source 304 is any component, circuit, or device capable of outputting a signal having a controllable value. For example, the output signal of the voltage source 304 may be controllable in value from a minimum of about zero volts (e.g., substantially equal to that present at the GND pin 116) to a maximum of about VREF (e.g., substantially equal to the value present at the VREF pin 112). In some examples, the voltage source 304 is controlled to generate an output signal having a value determined based on a value of VCODE. For example, based on a value of VCODE and a known value of resistance of the resistor 302, the logic circuit 102 controls the voltage source 304 to generate an output signal configured to cause an absolute value of a difference between VS and VREF/2 to be less than an absolute value of a difference between VCODE and VREF/2. Alternatively, VCODE may again be replaced by VP for use in controlling the voltage source 304. The voltage source 304 is controlled, in at least some examples, based on a signal received from the logic circuit 102. In at least some examples, the switch 306 is configured to decouple the resistor 302 and the voltage source 304 from the input pin 114 under certain circumstances. For example, based on a control signal received from the logic circuit 102, the switch 306 opens to decouple the resistor 302 and the voltage source 304 from the input pin 114 when VP is being determined by the logic circuit 102, as described elsewhere herein. Subsequently, based on the control signal received from the logic circuit 102, the switch 306 closes to couple the resistor 302 and the voltage source 304 to the input pin 114 when RCODE is being determined by the logic circuit 102, as described elsewhere herein.

Figure 4:
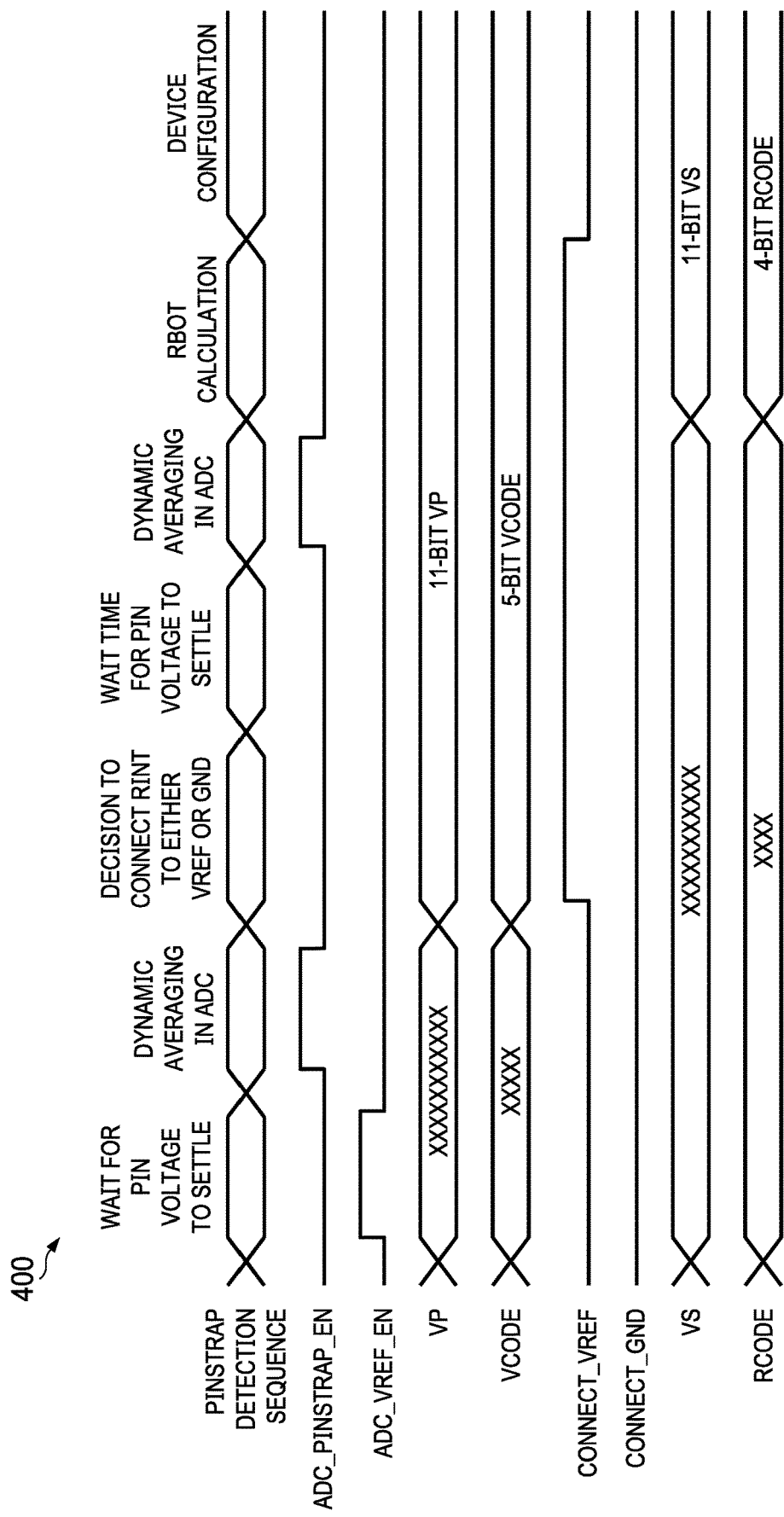
FIG. 4 shows a timing diagram of illustrative signals in accordance with various examples.

Turning now to FIG. 4, an illustrative timing diagram 400 is shown. In at least some examples, the timing diagram 400 is representative of at least some signals of, present in, or related to the electrical component 100 of FIG. 1. Accordingly, reference may be made to at least some components and/or signals of the electrical component 100 in describing the timing diagram 400.

The timing diagram 400 illustrates an illustrative pinstrap detection sequence and configuration of a device based on a result of the pinstrap detection. The timing diagram 400 illustrates a control signal ADC_PINSTRAP_EN and a control signal ADC_VREF_EN. The timing diagram 400 also illustrates VP, VCODE, CONNECT_VREF, CONNECT_GND, VS, and RCODE, each as discussed previously herein.

As discussed previously with respect to FIG. 1, the ADC 104 may be a multi-channel ADC. In such an example, ADC_PINSTRAP_EN is a signal output by the logic circuit 102 to control the ADC 104 to generate VP based on the voltage present at the input pin 114. For example, when ADC_PINSTRAP_EN is asserted (e.g., has a logical high value), the ADC 104 measures the voltage present at the input pin 114 and generates VP. The generation of VP is performed, in some examples, by the ADC 104 performing dynamic averaging to mitigate a possibility of inaccuracy in a value of VP occurring from a momentary variation in value of the voltage present at the input pin 114. Similarly, ADC_VREF_EN is a signal output by the logic circuit to control the ADC 104 to generate a digital signal representation of VREF based on the voltage present at the VREF pin 112. When ADC_VREF_EN is asserted (e.g., has a logical high value), the ADC 104 measures the voltage present at the VREF node 112 and generates a digital signal representation of VREF. The generation of the digital signal representation of VREF is performed, in some examples, by the ADC 104 performing dynamic averaging to mitigate a possibility of inaccuracy in a value of VREF occurring from a momentary variation in value VREF as present at the VREF pin 112. For the purposes of illustration of the timing diagram 400, it is assumed that VP is less than VREF/2 and therefore the logic circuit 102 asserts CONNECT_VREF. However, in other examples VP may instead be greater than VREF/2 such that states of CONNECT_VREF and CONNECT_GND are reversed from those shown in the timing diagram 400.

As illustrated in the timing diagram 400, the pinstrap detection sequence generally includes seven operations. However, in some examples more or fewer operations may be included and each of the operations may include one or more sub-operations that are not specifically shown in the timing diagram 400 and the timing diagram 400 may not be to scale (e.g., some operations may take longer than other operations). Furthermore, there may be a delay that is not shown in the timing diagram 400 between some operations (e.g., a delay after completion of one operation that generates a particular signal prior to the generation of a new signal based on the particular signal).

After startup, the electrical component 100 waits for the voltage present at the input pin 114 to settle (e.g., stabilize). While waiting for the voltage present at the input pin 114 to settle, the logic circuit 102 controls the ADC via the ADC_VREF_EN signal to generate a digital representation of VREF for storage and later use by the logic circuit 102. After the voltage present at the input pin 114 has settled, the logic circuit 102 controls the ADC 104 to measure the voltage present at the input pin 114 to generate VP. The logic circuit 102 performs the control, in at least some examples, via the ADC_PINSTRAP_EN signal. The ADC 104 performs the measurement of VP according to a dynamic averaging process, at the completion of which the ADC 104 generates and outputs VP as an 11-bit value (when the ADC 104 is an 11-bit ADC). The logic circuit 102 stores at least a portion of VP as VCODE and determines whether VP is greater than or less than VREF/2. A portion of VP stored as VCODE may be determined according to any suitable characteristics, such as a tolerance of the resistor 122 and the resistor 124, but in at least one example, at least the least significant 5 bits of VP are stored as VCODE. Based on the value of VP with respect to VREF/2, the logic circuit 102 asserts one of CONNECT_VREF or CONNECT_GND, with CONNECT_VREF being illustrated as asserted in the timing diagram 400. The electrical component 100 again waits for the voltage present at the input pin 114 to settle. After the voltage present at the input pin 114 has again settled, the logic circuit 102 controls the ADC 104 to measure the voltage present at the input pin 114 to generate VS. The logic circuit 102 performs the control, in at least some examples, via the ADC_PINSTRAP_EN signal. The ADC 104 performs the measurement of VS according to a dynamic averaging process, at the completion of which the ADC 104 generates and outputs VS as an 11-bit value (when the ADC 104 is an 11-bit ADC). After generation of VS, the logic circuit 102 generates RCODE as at least a 4-bit value. Subsequently, in at least some examples, the logic circuit 102 configures the electrical component 100 or another device according to the stored VCODE and the determined RCODE, where the values of VCODE and RCODE together uniquely correspond to a particular setting (or settings) of the electrical component 100 or another device being configured.

Figure 5:
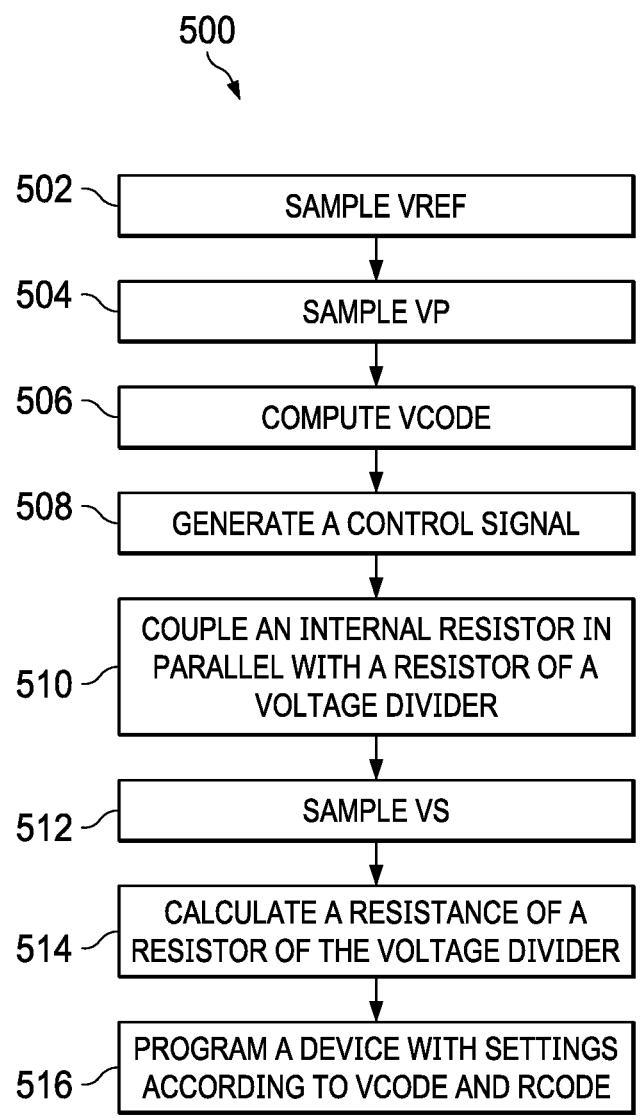
FIG. 5 shows a flowchart of an illustrative method of pinstrap detection in accordance with various examples.

Turning now to FIG. 5, a flowchart of an illustrative method 500 is shown. The method 500 is, in some examples, a pinstrap detection method. In at least some examples, the method 500 is implemented at least partially in, or by, the electrical component 100 (or components thereof) of FIG. 1. Accordingly, reference may be made to at least some components and/or signals of the electrical component 100 in describing the method 500.

At operation 502, VREF is sampled. In at least some examples, VREF is sampled by controlling the ADC 104 to make a measurement of VREF and generate a digital code representative of VREF using a channel of the ADC 104 that is coupled to the VREF pin 112. In some examples, the control is exerted by the logic circuit 102 outputting a channel select signal to the ADC 104 to cause the ADC 104 to sample the channel of the ADC 104 that is coupled to the VREF pin 112.

At operation 504, an input pin voltage is sampled to generate VP. In at least some examples, the input pin voltage is sampled by controlling the ADC 104 to measure the input pin voltage and generate VP as a digital representation of the input pin voltage using a channel of the ADC 104 that is coupled to the input pin 114. In some examples, the control is exerted by the logic circuit 102 outputting a channel select signal to the ADC 104 to cause the ADC 104 to sample the channel of the ADC 104 that is coupled to the input pin 114. Sampling the input pin voltage, in at least some examples, is a hardware operation that causes the ADC 104 to generate VP based on an analog value present at the input pin 114. VP, in at least some examples, is provided by the ADC 104 to the logic circuit 102 as one or more electrical impulses representing one or more digital bits.

At operation 506, VCODE is computed. In at least some examples, VCODE is computed by the logic circuit 102 by manipulating the digital code received from the ADC 104 (storing a portion of the digital code as VCODE). For example, when the ADC 104 outputs the digital code having 11 bits, in some implementations, only the least significant 5 bits of the digital code (or more generally, fewer than all 11 bits of the digital code) may be used in programming one or more settings despite all 11 bits being used in other calculations (such as in calculating RCODE). As such, in at least some examples VCODE is computed to include fewer than all bits of VP. In at least some examples, fewer than all 11 bits of the digital code are used in programming to compensate for potential error or inaccuracy resulting from error tolerance (e.g., such as about 1%) in actual values of RTOP and RBOT from ideal values of RTOP and RBOT, respectively. When lower tolerance (e.g., higher accuracy) resistors are utilized for the resistor 122 and the resistor 124, in at least some examples, a greater number of bits of the digital code than only the least significant 5 bits may be used in programming one or more settings. In other examples, the logic circuit 102 may generate VCODE by directly storing all bits of VP as VCODE. In at least some examples, after generating VCODE from VP, the logic circuit 102 stores VCODE in a storage element. In at least some examples, the logic circuit 102 also stores the received VP on which VCODE is based. The storage element may be a register, a cache, or any other volatile or non-volatile storage component or device. In at least some examples, VCODE is a digital value precise to at least 5 bits.

At operation 508, a control signal is generated. In at least some examples, the control signal is generated by the logic circuit 102. The logic circuit 102 generates the control signal, in at least some implementations, based on a value of VCODE with respect to a threshold. For example, in one implementation of the operation 508 the logic circuit 102 determines whether VCODE is less than, or greater than, a threshold to generate the control signal. For example, when VCODE is less than the threshold, the logic circuit generates an asserted first control signal and a de-asserted second control signal. When VCODE is greater than the threshold, the logic circuit generates a de-asserted first control signal and an asserted second control signal. In at least some examples, the threshold is a digital value representative of VREF/2.

At operation 510, an internal resistor (e.g., the resistor 106) is coupled in parallel with a resistor of the voltage divider 120. For example, when the first control signal is asserted, the internal resistor is coupled in parallel with the resistor 122 between the VREF pin 112 and the input pin 114. When the second control signal is asserted, the internal resistor is coupled in parallel with the resistor 124 between the input pin 114 and the GND pin 116. In at least some examples, coupling the internal resistor in parallel with a resistor of the voltage divider 120 causes a voltage of a signal present at the input pin 114 to change to be closer in value to VREF/2 than the voltage of the signal present at the input pin 114 was at the operation 504. In at least some examples, when the first control signal is asserted, a switch receiving the first control signal closes to cause the internal resistor to be coupled in parallel with the resistor 122. Similarly, when the second control signal is asserted, a switch receiving the second control signal closes to cause the internal resistor to be coupled in parallel with the resistor 124.

At operation 512, the input pin voltage is sampled to generate VS. In at least some examples, the input pin voltage is sampled by controlling the ADC 104 to measure the input pin voltage and generate VS as a digital representation of the input pin voltage using a channel of the ADC 104 that is coupled to the input pin 114. In some examples, the control is exerted by the logic circuit 102 outputting a channel select signal to the ADC 104 to cause the ADC 104 to sample the channel of the ADC 104 that is coupled to the input pin 114. Sampling the input pin voltage, in at least some examples, is a hardware operation that causes the ADC 104 to generate VS based on an analog value present at the input pin 114. The generated digital code, in at least some examples, is provided by the ADC 104 to the logic circuit 102 as one or more electrical impulses representing one or more digital bits.

At operation 514, a resistance of a resistor of the voltage divider 120 is calculated. In at least some examples, the resistance is of a bottom resistor of the voltage divider 120 (e.g., the resistor 124). In other examples, the resistance is of the resistor 122. In some examples in which the internal resistor was coupled in series with the resistor 122 at operation 510, the resistance of the resistor is determined according to the equation 1, as discussed above with respect to FIG. 1. In examples in which the internal resistor was coupled in series with the resistor 124 at operation 510, the resistance of the resistor is determined according to the equation 2, also as discussed above with respect to FIG. 1. In at least some examples, the resistance of the resistor is determined by the logic circuit 102. In at least some examples, the logic circuit 102 stores the resistance of the resistor in a storage element as RCODE. The storage element may be a register, a cache, or any other volatile or non-volatile storage component or device. In at least some examples, RCODE is a digital value precise to at least 4 bits such that VCODE and RCODE together accurately provide at least 9 bits of programmability (e.g., at least 511 distinct values) to the electrical component 100.

At operation 516, a device is programmed with a setting according to values of VCODE and RCODE. For example, the logic circuit 102 may program itself, or another component of the electrical component 100 may be programmed (either by the logic circuit 102 or by another component), with a particular setting according to VCODE and RCODE. In at least some examples, VCODE and RCODE may together provide for selecting from among at least 511 unique settings based on a ratio of resistance of a top resistor of the voltage divider to a bottom resistor of the voltage divider to control a value of VCODE and by controlling a value of resistance selected for RCODE.

While the operations of the method 500 have been discussed and labeled with numerical reference, in various examples the method 500 includes additional operations that are not recited herein. In some examples any one or more of the operations recited herein include one or more sub-operations (e.g., such as intermediary comparisons, logical operations, output selections such as via a multiplexer, format conversions, determinations, etc.). In some examples any one or more of the operations recited herein is omitted.

In some examples any one or more of the operations recited herein is performed in an order other than that presented herein (e.g., in a reverse order, substantially simultaneously, overlapping, etc.). Each of these alternatives is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology, these components may be exchanged for components of other process technologies and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. An integrated circuit, comprising:
    an analog-to-digital converter (ADC) comprising an ADC input and an ADC output;
    a logic circuit comprising an input and first and second outputs, in which the input of the logic circuit is coupled to the ADC output; and
    a resistance circuit, comprising:
        a first switch;
        a second switch; and
        a resistor;
        in which:
            the resistor is coupled between the ADC input and the first switch;
            the resistor is coupled between the ADC input and the second switch;
            the first switch is coupled between the resistor and a reference voltage terminal; and
            the second switch is coupled between the resistor and a ground terminal.

2. The integrated circuit of claim 1, wherein the ADC input is configured to: couple to the reference voltage terminal through a top resistor of a voltage divider; and couple to the ground terminal through a bottom resistor of the voltage divider.

3. The integrated circuit of claim 1, wherein the logic circuit is configured to generate a first ADC control signal, and the ADC is configured to determine a first voltage at the ADC input responsive to the first ADC control signal.

4. The integrated circuit of claim 3, wherein the logic circuit is configured to generate a switch control signal, and wherein:
    the first switch is configured to couple the resistor between the ADC input and the reference voltage terminal responsive to the switch control signal, based on the voltage at the ADC input with respect to a threshold; or
    the second switch is configured to couple the resistor between the ADC input and the ground terminal responsive to the switch control signal, based on the first voltage with respect to the threshold.

5. The integrated circuit of claim 4, wherein:
    the first switch is configured to couple the resistor between the ADC input and the reference voltage terminal when the first voltage is less than the threshold; and
    the second switch is configured to couple the resistor between the ADC input and the ground terminal when the first voltage is greater than the threshold.

6. The integrated circuit of claim 4, wherein the logic circuit is configured to generate a second ADC control signal, and the ADC is configured to determine a second voltage at the ADC input responsive to the second ADC control signal, in which the second voltage is modified by the coupling of the resistor between the ADC input and one of the reference voltage terminal or the ground terminal.

7. The integrated circuit of claim 6, wherein the logic circuit is configured to determine a resistance of an element coupled to the ADC input according to the second voltage, a reference voltage at the reference voltage terminal, and a resistance of the resistor.

8. The integrated circuit of claim 7, wherein the logic circuit is configured to program a setting of the circuit according to the second voltage and the resistance of the element.

9. The integrated circuit of claim 1, wherein the logic circuit is a first logic circuit and has a third output, the integrated circuit further comprises a second logic circuit having an output and first and second inputs, the output of the second logic circuit is coupled to a control terminal of the second switch, the first input is coupled to the second output of the first logic circuit, and the second input is coupled to the third output of the first logic circuit.

10. The integrated circuit of claim 9, wherein the second logic circuit is configured to perform a logical OR operation between the first and second inputs of the second logic circuit.

11. An integrated circuit, comprising:
an analog-to-digital converter (ADC) comprising an ADC input, an ADC output and a control input;
a resistance circuit comprising an input and an output, in which the output of the resistance circuit is coupled to the ADC input; and
a logic circuit comprising an input and first and second outputs, in which the input of the logic circuit is coupled to the ADC output, the first output of the logic circuit is coupled to the input of the resistance circuit, the second output of the logic circuit is coupled to the control input, and the logic circuit is configured to:
generate a first ADC control signal at the second output, in which the ADC is configured to determine a first voltage at the ADC input with a first resistance at the ADC input, responsive to the first ADC control signal;
generate a control signal at the first output, in which the resistance circuit is configured to modify the first resistance to a second resistance at the ADC input, responsive to the control signal;
generate a second ADC control signal at the second output, in which the ADC is configured to determine a second voltage at the ADC input with the second resistance at the ADC input, responsive to the second ADC control signal; and
determine the first resistance based at least partially on the second voltage, a resistance of the resistance circuit, and a reference voltage at a reference voltage terminal.

12. The integrated circuit of claim 11, wherein the resistance circuit comprises:
a first switch;
a second switch; and
a resistor;
in which:
the resistor is coupled between the ADC input and the first switch;
the resistor is coupled between the ADC input and the second switch;
a resistance of the resistor is the resistance of the resistance circuit;
the first switch is coupled between the resistor and the reference voltage terminal; and
the second switch is coupled between the resistor and a ground terminal.

13. The integrated circuit of claim 12, wherein the resistance circuit is configured to modify the first resistance to the second resistance by:
responsive to the control signal, control the first switch to couple the ADC input to the reference voltage terminal when the first voltage is less than a threshold; and
responsive to the control signal, control the second switch to couple the ADC input to the ground terminal when the first voltage is greater than the threshold, in which the threshold is approximately one-half of the reference voltage, the first resistance is a resistance of a resistor of a voltage divider coupled between the reference voltage terminal and the ground terminal, and the voltage divider has an output coupled to the ADC input.

14. The integrated circuit of claim 11, wherein the resistance circuit comprises:
a first resistor;
a first switch coupled between the first resistor and the reference voltage terminal, in which the first resistor is coupled between the first switch and the ADC input;
a second resistor;
a second switch coupled between the second resistor and the reference voltage terminal, in which the second resistor is coupled between the second switch and the ADC input;
a third resistor;
a third switch coupled between the third resistor and a ground terminal, in which the third resistor is coupled between the third switch and the ADC input;
a fourth resistor; and
a fourth switch coupled between the fourth resistor and the ground terminal, in which the fourth resistor is coupled between the fourth switch and the ADC input.

15. The integrated circuit of claim 14, wherein the first resistor, the second resistor, the third resistor, and the fourth resistor have different resistances from one another, and the resistance circuit is configured to modify the first resistance to the second resistance by:
responsive to the control signal, closing one of the first switch, the second switch, the third switch, or the fourth switch based on the first voltage and a resistance of the first resistor, the second resistor, the third resistor, or the fourth resistor, respectively, in which the first resistance is a resistance of a resistor of a voltage divider coupled between the reference voltage terminal and the ground terminal, and the voltage divider has an output coupled to the ADC input.

16. The integrated circuit of claim 11, wherein the resistance circuit comprises:
a voltage source; and
a resistor coupled between the ADC input and the voltage source, in which the voltage source is coupled between the resistor and the first output.

17. The integrated circuit of claim 16 wherein the resistance circuit is configured to modify the first resistance to the second resistance by controlling an output voltage of the voltage source based on the first voltage, the first resistance is a resistance of a resistor of a voltage divider coupled between the reference voltage terminal and a ground terminal, and the voltage divider has an output coupled to the ADC input.

18. A system, comprising:
a programmable electrical component comprising:
an analog-to-digital converter (ADC) comprising an ADC input, an ADC output and a control input;
a resistance circuit comprising an input and an output, in which the output of the resistance circuit is coupled to the ADC input; and
a logic circuit comprising an input and first and second outputs, in which the input of the logic circuit is coupled to the ADC output, the first output of the logic circuit is coupled to the input of the resistance circuit, the second output of the logic circuit is coupled to the control input, and the logic circuit is configured to:
generate a first ADC control signal at the second output, in which the ADC is configured to determine a first voltage at the ADC input with a first resistance at the ADC input, responsive to the first ADC control signal;

generate a control signal at the first output, in which the resistance circuit is configured to modify the first resistance to a second resistance at the ADC input, responsive to the control signal;

generate a second ADC control signal at the second output, in which the ADC is configured to determine a second voltage at the ADC input with the second resistance at the ADC input, responsive to the second ADC control signal; and determine the first resistance based at least partially on the second voltage, a resistance of the resistance circuit, and a reference voltage at a reference voltage terminal; and a voltage divider coupled between the reference voltage terminal and a ground terminal, in which the voltage divider has an output coupled to the ADC input.

19. The system of claim 18, wherein the programmable electrical component is programmable to one of at least 511 settings by modifying a ratio of resistance of a top resistor of the voltage divider to a bottom resistor of the voltage divider to control the first voltage and by controlling resistance of a resistor of the voltage divider.

20. The system of claim 18, wherein the logic circuit is configured to determine the first resistance according to the reference voltage, a voltage at the ADC input when the resistance circuit is inactive, a voltage at the ADC input when the resistance circuit is coupled into a signal path between the ADC input and the reference voltage terminal or a signal path between the ADC input and the ground terminal, and a resistance of the resistance circuit.

* * * * *